(12) United States Patent
Hou

(10) Patent No.: US 8,488,349 B2
(45) Date of Patent: Jul. 16, 2013

(54) METHOD AND APPARATUS FOR TRACKING POWER SUPPLIES

(75) Inventor: Zhaozheng Hou, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 190 days.

(21) Appl. No.: 12/893,591

(22) Filed: Sep. 29, 2010

(65) Prior Publication Data

US 2011/0074486 A1    Mar. 31, 2011

(30) Foreign Application Priority Data

Sep. 30, 2009 (CN) .......................... 2009 1 0174588

(51) Int. Cl.
*H02J 1/10* (2006.01)

(52) U.S. Cl.
USPC ............................................ 363/65

(58) Field of Classification Search
USPC ............... 363/21.05, 21.06, 21.13, 21.14, 65,
363/71, 72; 330/9, 10, 297; 307/82, 83, 84
See application file for complete search history.

(56) References Cited

U.S. PATENT DOCUMENTS

| | | | | |
|---|---|---|---|---|
| 4,403,197 A | * | 9/1983 | Swanson | 330/10 |
| 4,730,167 A | * | 3/1988 | Beeken et al. | 330/10 |
| 4,745,368 A | * | 5/1988 | Lodahl | 330/10 |
| 4,831,334 A | | 5/1989 | Hudspeth et al. | |
| 5,392,007 A | * | 2/1995 | Cripe | 332/149 |
| 7,482,869 B2 | | 1/2009 | Wilson | |
| 2007/0279019 A1 | | 12/2007 | Wilson | |

FOREIGN PATENT DOCUMENTS

| | | |
|---|---|---|
| CN | 101662222 B | 1/2012 |
| EP | 0267391 A1 | 9/1987 |
| EP | 0327682 A1 | 10/1988 |

OTHER PUBLICATIONS

Notice of Allowance issued in corresponding Chinese Patent Application No. 200910174588.1; mailed Oct. 31, 2011 (including English Translation and Verification of Translation.
English translation of granted claims in corresponding Chinese Patent Application No. 200910174588.1 (including Verification of Translation).
Office Action issued in corresponding Chinese Patent Application No. 200910174588.1; mailed Mar. 10, 2011 (including verification of translation).

(Continued)

*Primary Examiner* — Nguyen Tran
(74) *Attorney, Agent, or Firm* — Brinks Hofer Gilson & Lione

(57) ABSTRACT

A method for tracking power supplies includes the following steps: receiving, by a controller, a signal to be tracked and outputting, according to the signal to be tracked, a control signal. The control signal controls at least two sets of voltage level selection circuits in selecting at least one tracking voltage level from at least two groups of isolation voltage levels and controls each set of the voltage level selection circuits selecting at most one tracking voltage level from a group of isolation voltage levels. An isolation power supply provides the at least two groups of isolation voltage levels according to the voltage level interval of the signal to be tracked. Each group of isolation voltage levels includes at least two tracking voltage levels. The voltage level selection circuits provide the selected tracking voltage level to supply power to a load circuit. An apparatus for tracking power supplies is also provided. The present disclosure is applicable to the power supply tracking on a reference signal.

13 Claims, 12 Drawing Sheets

OTHER PUBLICATIONS

Extended European Search Report issued in corresponding European Patent Application No. 10183736.7, mailed Jan. 25, 2011.

Office Action issued in corresponding European Patent Application No. 10183736.7, mailed Sep. 13, 2012.

* cited by examiner

METHOD AND APPARATUS FOR TRACKING POWER SUPPLIES

CROSS-REFERENCE TO RELATED APPLICATION

This application claims priority to Chinese Patent Application No. 200910174588.1, filed on Sep. 30, 2009, which is hereby incorporated by reference in its entirety.

FIELD OF THE DISCLOSURE

The present disclosure relates to a communication technology, and in particular, to a method and apparatus for tracking power supplies.

BACKGROUND OF THE DISCLOSURE

In modern wireless communication systems, such as the code division multiple access (CDMA) system, wideband code division multiple access (WCDMA) system, universal mobile telecommunication system (UMTS), and long term evolution (LTE) system, a variable envelope modulation technology that performs amplitude modulation and phase modulation concurrently is used to fully utilize the spectrum. This technology has a high peak to average power ratio (PAPR) and a wide dynamic range. However, if the PAPR is too high, the transmit end may impose high requirements upon the linearity of the power amplifier and always run under the peak voltage level.

The variable envelope modulation technology needs to amplify signals by using a linear power amplifier. To ensure the linearity, a power backoff method is generally used. However, the power backoff method may reduce the output capacity and power efficiency of the power amplifier. The envelope tracking (ET) technology is one effective method for improving the efficiency of the power amplifier in the case of a high PAPR. By using the ET technology, high power efficiency can always be maintained in the case of peak output power and low output power. The combination of the ET technology and digital pre-distortion (DPD) technology can not only ensure the linearity but also improve the efficiency of the power amplifier. With the development of the multi-carrier technology, the bandwidth of an envelope signal may also reach several tens of MHz. Due to the limiting factors such as the semiconductor technology and switching frequency, the bandwidth of an ordinary switching power supply can hardly meet the requirement of the ET bandwidth. In addition, the output noise and distortion may be modulated to carriers, thus causing spread of the out-of-band spectrum and greatly affecting the adjacent channel power ratio (ACPR) of the signal.

When the output voltage is used for switching directly and the number of voltage levels is associated with the number of control circuits, a substantial number of voltage levels and circuits are required to implement high-accuracy tracking.

SUMMARY OF THE DISCLOSURE

Embodiments of the present disclosure provide a method and apparatus for tracking power supplies, so that the power supply tracking accuracy is improved when fewer circuits are used to track power supplies.

The technical solution provided in embodiments of the present disclosure is described herein. A method for tracking power supplies includes receiving, by a controller, a signal to be tracked, outputting, by the controller, according to the signal to be tracked, a control signal to control at least two sets of voltage level selection circuits in selecting at least one tracking voltage level from at least two groups of isolation voltage levels and to control each set of voltage level selection circuits selecting at most one tracking voltage level from a corresponding group of isolation voltage levels, where an isolation power supply provides the at least two groups of isolation voltage levels according to a voltage level interval of the signal to be tracked and each group of isolation voltage levels includes at least two tracking voltage levels, and providing, by the voltage level selection circuits, the selected tracking voltage level to supply power to a load circuit.

An apparatus for tracking power supplies includes an isolation power supply configured to provide at least two groups of isolation voltage levels according to a voltage level interval of a signal to be tracked, where each group of isolation voltage levels includes at least two tracking voltage levels, a controller configured to receive the signal to be tracked and to output, according to the signal to be tracked, a control signal to control voltage level selection circuits, and at least two sets of voltage level selection circuits configured to select at least one tracking voltage level from the at least two groups of isolation voltage levels provided by the isolation power supply under the control of the controller, where each set of voltage level selection circuits is configured to select at most one tracking voltage level from a corresponding group of isolation voltage levels under the control of the controller to supply power to a load circuit.

By using the method and apparatus for tracking power supplies according to embodiments of the present disclosure, the controller can output, according to the signal to be tracked, a control signal to control at least two sets of voltage level selection circuits in selecting at least one tracking voltage level from at least two groups of isolation voltage levels provided by the isolation power supply. The selected tracking voltage level(s) is provided to supply power to the load circuit through the voltage level selection circuits. Thus, the power supply tracking is implemented on the signal to be tracked. In comparison with the method of selecting directly one-to-one single voltage level from one group voltage levels, in embodiments of the present disclosure, a control signal is output according to the voltage level of the signal to be tracked to control the voltage level selection circuits in selecting tracking voltage levels. The combination of the selected tracking voltage levels can be closest to the voltage level of the signal to be tracked. Thus, the power supply tracking accuracy can be improved when fewer circuits are used to track power supplies.

BRIEF DESCRIPTION OF THE DRAWINGS

To make the technical solution of the present disclosure clearer, the accompanying drawings for illustrating the embodiments of the present disclosure or the prior art are outlined below. Apparently, the accompanying drawings are exemplary only, and persons having ordinary skill in the art can derive other drawings from such accompanying drawings without any creative effort.

DETAILED DESCRIPTION OF THE EMBODIMENTS

The technical solution under the present disclosure is described below with reference to accompanying drawings. Evidently, the embodiments described below are exemplary only, without covering all embodiments of the present disclosure. Additionally, all other embodiments, which can be derived by those skilled in the art from the embodiments given herein without any creative efforts, fall within the scope of the present disclosure.

For better understanding of the technical solution of the present disclosure, the present disclosure is hereinafter described in detail with reference to the accompanying drawings and exemplary embodiments.

First Embodiment

Figure 1:
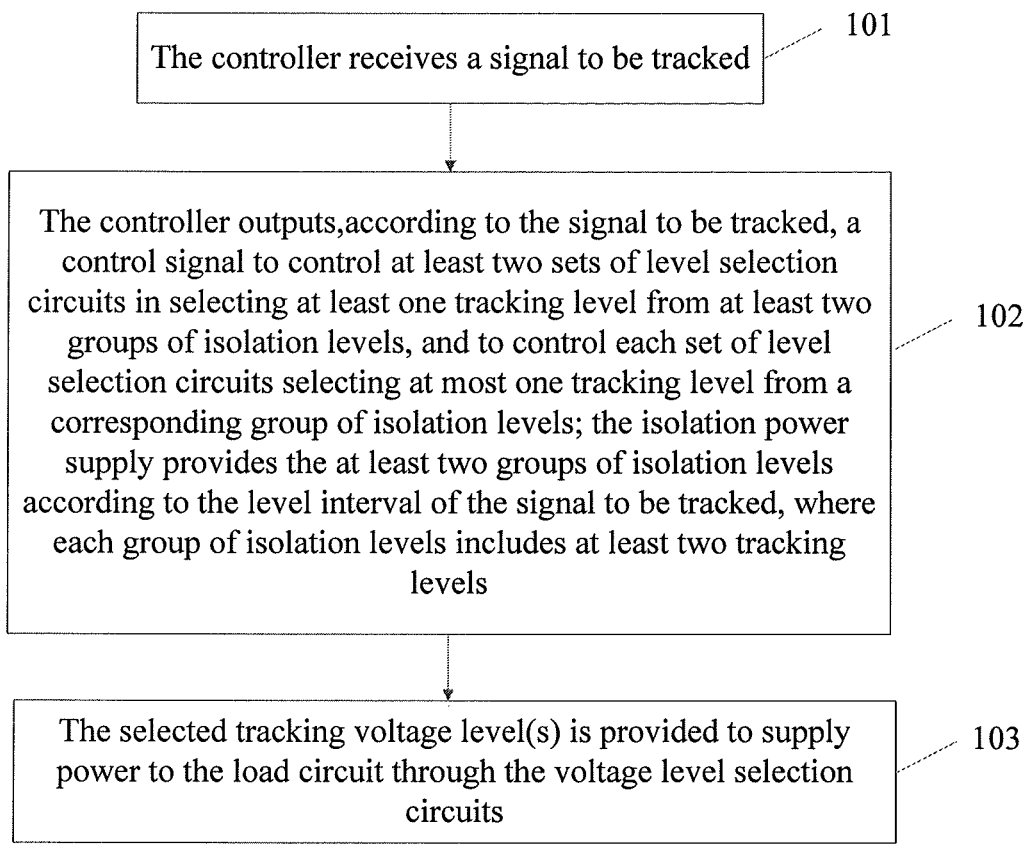
FIG. 1 is a flowchart of a method for tracking power supplies according to a first embodiment of the present disclosure.

The first embodiment of the present disclosure provides a method for tracking power supplies. As shown in FIG. 1, the method for tracking power supplies includes the following steps:

Step 101: The controller receives a signal to be tracked. The controller may be but is not limited to the following: a field programmable gate array (FPGA), a digital signal processor (DSP), a complex programmable logical device (CPLD) or a combination of discrete components.

Step 102: The controller outputs, according to the signal to be tracked, a corresponding control signal to control at least two sets of voltage level selection circuits in selecting at least one tracking voltage level from at least two groups of isolation voltage levels. Each set of voltage level selection circuits selects at most one tracking voltage level from a corresponding group of isolation voltage levels, where the control signal may be but is not limited to a control voltage level.

The isolation power supply provides the at least two groups of isolation voltage levels according to the voltage level interval of the signal to be tracked. Each group of isolation voltage levels includes at least two tracking voltage levels. Specifically, the process of providing the at least two groups of isolation voltage levels by the isolation power supply according to the voltage level interval of the signal to be tracked is described herein.

The voltage level interval of the signal to be tracked is firstly divided into multiple voltage level intervals which are assigned as a first group of isolation voltage levels, and a voltage level interval with a minimum resolution value of the previously divided multiple voltage level intervals is sub-divided i.e., divided again into multiple voltage level intervals which are assigned as a second group of isolation voltage levels. There may be at least two iterations of dividing.

The isolation power supply provides multiple groups of isolation voltage levels, and the multiple groups of isolation voltage levels at least include the first group of isolation voltage levels and the second group of isolation voltage levels, where the first group of isolation voltage levels corresponds to a firstly divided multiple voltage level intervals, and the second group of isolation voltage levels corresponds to a sub-divided multiple voltage level intervals.

The voltage level interval of the signal to be tracked is roughly divided into multiple voltage level intervals which are assigned as the first group of isolation voltage levels A1-An. A voltage level interval with a minimum resolution value of the roughly divided multiple voltage level intervals is sub-divided into fine voltage level intervals which are assigned as the second group of isolation voltage levels B1-Bm, where the first group of isolation voltage levels is isolated from the second group of isolation voltage levels. A voltage level interval with a minimum resolution value of the fine voltage level intervals may be further divided into voltage level intervals which are assigned as a group of isolation voltage levels, and the group of isolation voltage levels is isolated from the second group of isolation voltage levels. The times of dividing the voltage level interval of the signal to be tracked may be determined according to factors such as the required tracking accuracy, bearable cost, and area. The isolation power supply provides at least two groups of isolation voltage levels according to the divided voltage level intervals.

In an implementation mode, the tracking voltage level is specifically a current value or a voltage value. The combination of at least one selected tracking voltage level should be closest to the current value or voltage value of the signal to be tracked to better track power supplies.

Step 103: The selected tracking voltage level(s) is provided to supply power to the load circuit through the voltage level selection circuits.

By using the method for tracking power supplies according to this embodiment of the present disclosure, the controller can output a corresponding control signal according to the signal to be tracked, where the control signal is used for controlling at least two sets of voltage level selection circuits in selecting at least one tracking voltage level from at least two groups of isolation voltage levels provided by the isolation power supply. The selected tracking voltage level(s) is provided to supply power to the load circuit through the voltage level selection circuits. Thus, the power supply tracking is implemented on the signal to be tracked. In comparison with the method of selecting directly one-to-one single voltage level from one group of voltage levels, in this embodiment of the present disclosure, a control signal is output, according to the voltage level of the signal to be tracked, to control the voltage level selection circuits in selecting tracking voltage levels. The combination of the selected tracking voltage levels can be closest to the voltage level of the signal to be tracked. Thus, the power supply tracking accuracy can be improved when fewer circuits are used to track power supplies.

Second Embodiment

In this embodiment, the voltage level interval of the signal to be tracked is firstly divided into multiple voltage level intervals which form a first group of voltage level intervals, and a voltage level interval with a minimum resolution value of the previously divided multiple voltage level intervals is divided again into multiple voltage level intervals which form a second group of voltage level intervals. The two groups of voltage level intervals, i.e. the first group of voltage level intervals and the second group of voltage level intervals are isolated from each other, and each group of voltage level intervals forms three tracking voltage levels. The isolation power supply provides two groups of isolation voltage levels corresponding to the two groups of voltage level intervals, where each group of isolation voltage levels includes three tracking voltage levels. Accordingly, there are two sets of voltage level selection circuits, where the first voltage level selection circuit corresponds to the first group of isolation voltage levels and the second voltage level selection circuit corresponds to the second group of isolation voltage levels.

Figure 2:
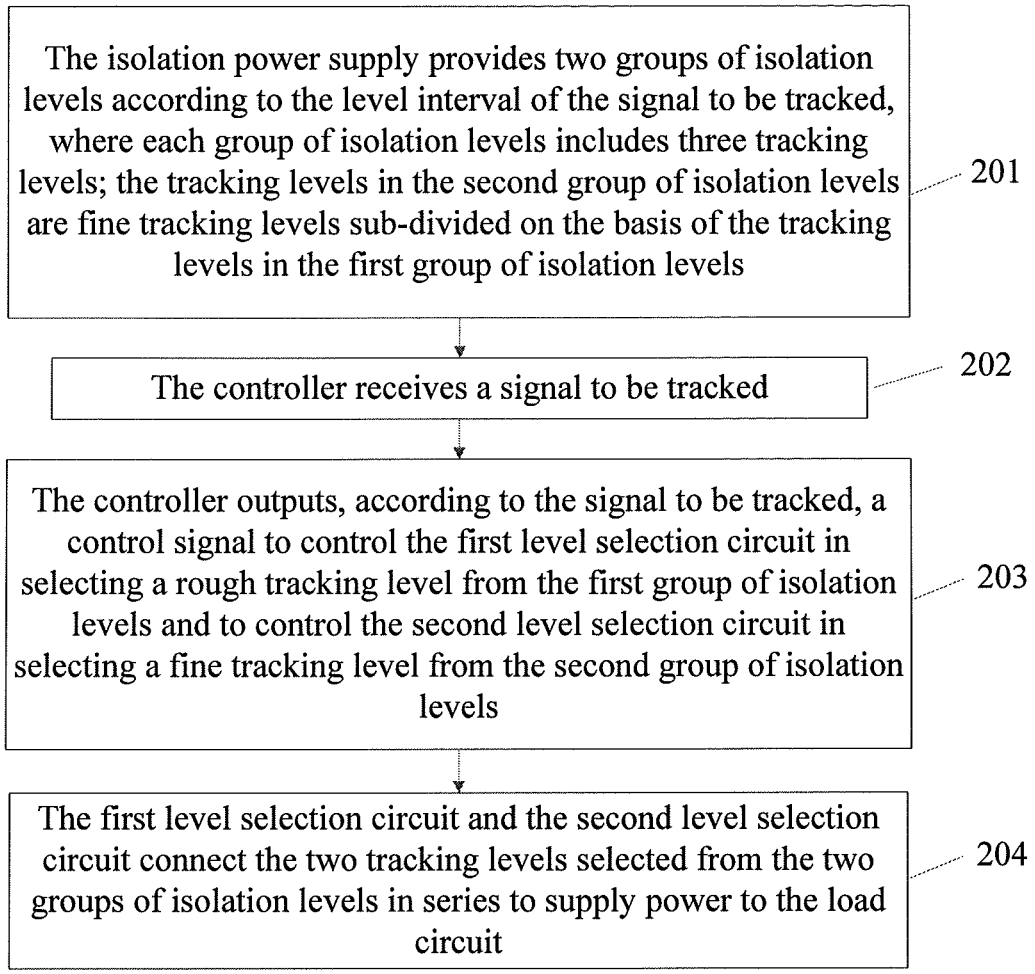
FIG. 2 is a flowchart of a method for tracking power supplies according to a second embodiment of the present disclosure.

As shown in FIG. 2, a method for tracking power supplies according to the second embodiment of the present disclosure includes the following steps:

Step 201: The isolation power supply provides two groups of isolation voltage levels according to the isolated two groups of voltage level intervals, where each group of isolation voltage levels includes three tracking voltage levels. The tracking voltage levels in the first group of isolation voltage levels are rough tracking voltage levels, and the tracking voltage levels in the second group of isolation voltage levels are fine tracking voltage levels sub-divided on the basis of the rough tracking voltage levels.

The isolation power supply is a switching power supply. It may include, but is not limited to, one or any combination of the following: forward circuit, backward circuit, half-bridge circuit, full-bridge circuit, and/or push-pull circuit.

The isolation power supply may adopt, but is not limited to, the following form: a coupled primary transformer, one primary circuit, or multiple primary circuits.

Step 202: The controller receives a signal to be tracked.

The controller may be, but is not limited to, the following: an FPGA, a DSP, a CPLD, or a combination of discrete components.

Step 203: The controller outputs, according to the signal to be tracked, a corresponding control signal to control the first voltage level selection circuit in selecting a rough tracking voltage level from the first group of isolation voltage levels and to control the second voltage level selection circuit in selecting a fine tracking voltage level from the second group of isolation voltage levels. The controller may control only the first voltage level selection circuit in selecting a rough tracking voltage level from the first group of isolation voltage levels or control only the second voltage level selection circuit in selecting a fine tracking voltage level from the second group of isolation voltage levels. The selection principle may be that the combination of the at least one selected tracking voltage level should be closest to the current value or voltage value of the signal to be tracked, thus power supplies is better tracked. In the subsequent description of this embodiment, it is assumed that the first voltage level selection circuit selects a rough tracking voltage level from the corresponding first group of isolation voltage levels and that the second voltage level selection circuit selects a fine tracking voltage level from the corresponding second group of isolation voltage levels.

When the frequency of the signal to be tracked is greater than the frequency upper limit, the controller matches the delays of each tracking voltage level selected by the voltage level selection circuits to align with the corresponding tracking voltage level. The frequency upper limit may be determined according to the actual condition, and is not limited in this embodiment.

The voltage level selection circuit includes a semiconductor switch and a drive circuit. The semiconductor switch is connected to the isolation power supply, and the drive circuit is connected to the controller and configured to drive the semiconductor switch. The drive circuit may be, but is not limited to, a bootstrap drive circuit or an isolated drive circuit. The drive voltage level reference point is not a ground voltage level. The semiconductor switch includes a switch tube and a diode, where the switch tube may be connected in front of the diode or behind the diode. The diode is configured to prevent pass of different voltage levels in a reverse direction. The switch tube may be, but is not limited to, a high-speed metal-oxide-semiconductor field effect transistor (MOSFET).

Step 204: The first voltage level selection circuit and the second voltage level selection circuit connect the two tracking voltage levels selected from the two groups of isolation voltage levels (i.e., the selected rough tracking voltage level and the selected fine tracking voltage level) in series to supply power to the load circuit.

When the controller controls only the first voltage level selection circuit in selecting a tracking voltage level from the first group of isolation voltage levels or controls only the second voltage level selection circuit in selecting a tracking voltage level from the second group of isolation voltage levels, the selected tracking voltage level is provided to supply power to the load circuit directly through a corresponding voltage level selection circuit.

Figure 3:
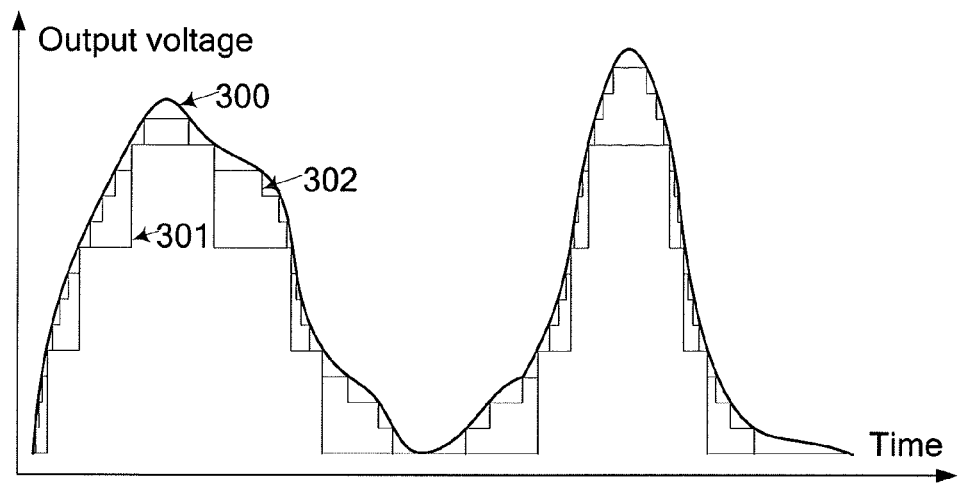
FIG. 3, FIG. 4, and FIG. 5 illustrate the waveform of a tracked signal in the method for tracking power supplies according to the second embodiment of the present disclosure.

FIG. 3 illustrates a waveform when the controller adopts a first control signal. As shown in FIG. 3, 300 represents an accurate output signal corresponding to the signal to be tracked, 301 represents an output signal tracked by the rough voltage level only, and 302 represents an output signal tracked by the voltage level combined from the rough voltage level and the fine voltage level 1. Thus, the voltage level combined from the rough voltage level and the fine voltage level can track a reference signal accurately.

Figure 4:
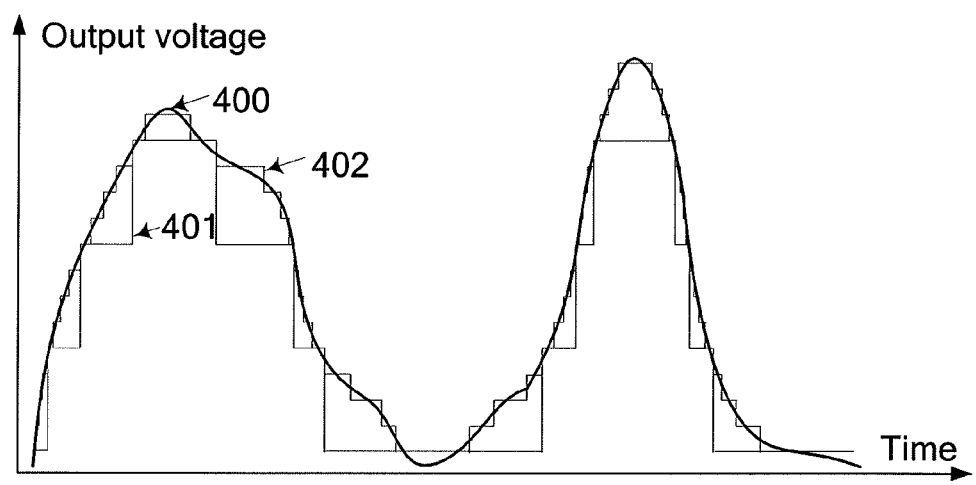

FIG. 4 illustrates a waveform when the controller adopts a second control signal. As shown in FIG. 4, 400 represents an accurate output signal corresponding to the signal to be tracked, 401 represents an output signal tracked by the rough voltage level only, and 402 represents an output signal tracked by a rough voltage level and a fine voltage level. Thus, the voltage level combined from the rough voltage level and the fine voltage level can track a reference signal accurately.

Figure 5:
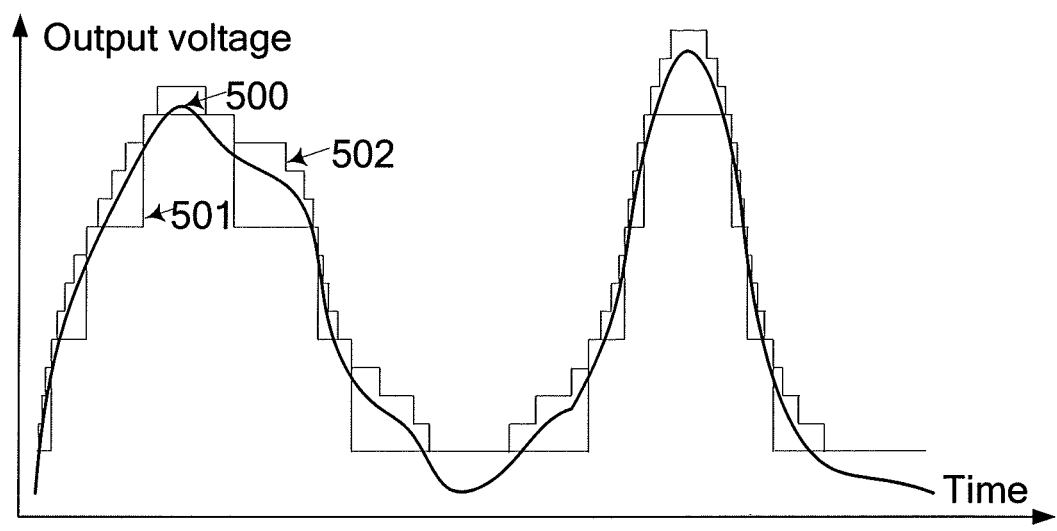

FIG. 5 illustrates a waveform when the controller adopts a third control signal. As shown in FIG. 5, 500 represents an accurate output signal corresponding to the signal to be tracked, 501 represents an output signal tracked by the rough voltage level only, and 502 represents an output signal tracked by a rough voltage level and a fine voltage level. Thus, the voltage level combined from the rough voltage level and the fine voltage level can track a reference signal accurately.

In this embodiment, the voltage level selection circuit includes six sets of circuits and can provide 15 tracking voltage levels within the voltage level interval of the signal to be tracked. Compared with the method of selecting single voltage level from a group of 15 voltage levels directly, this method according to the embodiment of the present disclosure can reduce 9 sets of circuits, thus reducing the number of circuits and occupied areas of the circuits on the printed circuit board (PCB).

As can be seen from that, by using the method for tracking power supplies according to this embodiment of the present disclosure, the controller can output, according to the signal to be tracked, a control signal to control two sets of voltage level selection circuits in selecting at least one tracking voltage level from two groups of isolation voltage levels provided by the isolation power supply. The selected tracking voltage level(s) is provided to supply power to the load circuit through the voltage level selection circuits. Thus, the power supply tracking is implemented on the signal to be tracked. In comparison with the method of selecting directly one-to-one single voltage level from one group of voltage levels, in this embodiment of the present disclosure, a control signal is output, according to the voltage level of the signal to be tracked, to control two sets of voltage level selection circuits in selecting two tracking voltage levels. The voltage level selection circuits connect the two selected tracking voltage levels in series to supply power to the load circuit. Thus, the power supply tracking accuracy can be improved.

In addition, according to this embodiment of the present disclosure the number of switching circuits and the occupied areas of the circuits on the PCB are reduced, and the number of control inputs and the number of power circuits are reduced, thus the cost is lower. The controller matches the delays of each tracking voltage level selected by the voltage level selection circuits, thus further the tracking accuracy is improved. Further, the switching frequency corresponding to the rough voltage level is smaller than the switching frequency corresponding to the equally divided voltage level, thus the switching loss is reduced and the overall power supply tracking efficiency is improved.

Third Embodiment

In this embodiment, the voltage level interval of the signal to be tracked is firstly divided into multiple voltage level intervals which form a first group of voltage level intervals, and a voltage level interval with a minimum resolution value of the previously divided multiple voltage level intervals is divided again into multiple voltage level intervals which form a second group of voltage level intervals. The first group of voltage level intervals and the second group of voltage level intervals are isolated from each other, and each group of voltage level intervals forms three tracking voltage levels. The isolation power supply provides two groups of isolation voltage levels corresponding to the two groups of voltage level intervals, where each group of isolation voltage levels includes three tracking voltage levels. In this embodiment, the linear amplifier provides a compensation voltage. The compensation voltage and the tracking voltage levels selected by the voltage level selection circuits are connected in series to supply power to the load circuit. Accordingly, there are two sets of voltage level selection circuits, where the first voltage level selection circuit corresponds to the first group of isolation voltage levels and the second voltage level selection circuit corresponds to the second group of isolation voltage levels.

Figure 6:
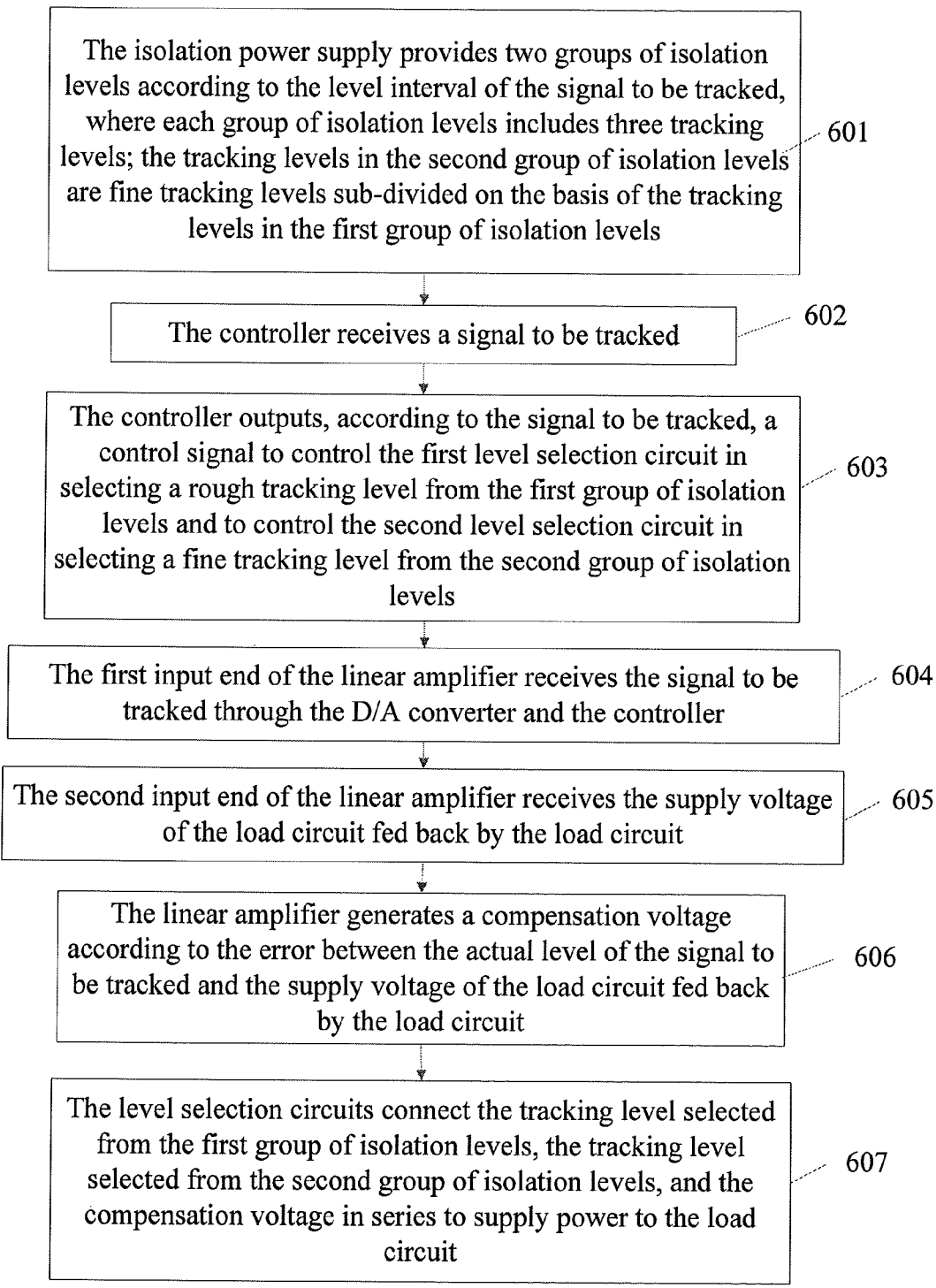
FIG. 6 is a flowchart of a method for tracking power supplies according to a third embodiment of the present disclosure.

As shown in FIG. 6, a method for tracking power supplies according to the third embodiment of the present disclosure includes the following steps:

Step 601 to step 603: The two sets of voltage level selection circuits select one or two tracking voltage levels. The selection operation was described in detail with regards to steps 201 to 203 and therefore will not be discussed here.

Step 604: The first input end of the linear amplifier receives a signal to be tracked through the D/A converter and the controller.

Step 605: The second input end of the linear amplifier receives the supply voltage of the load circuit fed back by the load circuit.

Step 606: The linear amplifier generates a compensation voltage according to the error between the actual voltage level of the signal to be tracked and the supply voltage of the load circuit fed back by the load circuit.

According to the combination relationship between the linear amplifier and the switching voltage level, the linear amplifier may compensate errors, reduce errors, and compensate-reduce errors. The linear amplifier may be designed in a push structure, a pull structure or a push-pull structure. Class A linear amplifier, Class B linear amplifier, and Class AB linear amplifier may be used. The linear power tube may be a MOSFET, a transistor, or a high-frequency power tube with good frequency characteristics. To improve the tracking accuracy, the linear amplifier may adopt output feedback control.

Step 607: The voltage level selection circuits (including the first voltage level selection circuit and the second voltage level selection circuit) connect the tracking voltage level selected from the first group of isolation voltage levels, the tracking voltage level selected from the second group of isolation voltage levels, and the compensation voltage in series to supply power to the load circuit.

When the controller controls only one set of voltage level selection circuits in selecting a tracking voltage level from the isolation voltage levels, the one set of voltage level selection circuits connect the selected tracking voltage level and the compensation voltage in series to supply power to the load circuit.

When the frequency of the signal to be tracked is greater than the frequency upper limit, the controller matches the delays of each tracking voltage level selected by the voltage level selection circuits to align with the tracking voltage levels. The frequency upper limit may be determined according to the actual condition, and is not limited in this embodiment.

Figure 7:
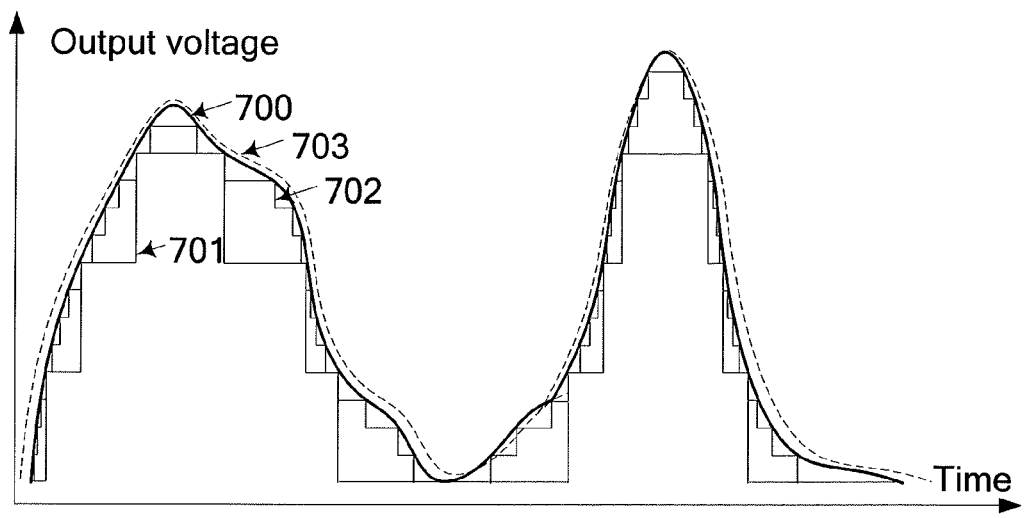
FIG. 7, FIG. 8, and FIG. 9 illustrate the waveform of a tracked signal in the method for tracking power supplies according to the third embodiment of the present disclosure.

FIG. 7 illustrates a waveform of compensating errors by the linear amplifier when the controller adopts a first control signal. 700 represents an accurate output signal corresponding to the signal to be tracked, 701 represents an output signal tracked by a rough voltage level, 702 represents an output signal tracked by a rough voltage level and a fine voltage level, and 703 represents an output signal tracked by the combination of a rough voltage level, a fine voltage level, and the linear compensation voltage. Thus, the voltage level combined from the rough voltage level and the fine voltage level can track a reference signal accurately. In addition, the power needed by the linear amplifier to correct the switching voltage level t racking error (the integral is equal to the square of the error between the vertical axis of resistive loads 700 and 702 divided by the load) is smaller than the power needed for correcting a single rough switching voltage level (the integral is equal to the square of the error between the vertical axis of resistive loads 700 and 701 divided by the load).

Figure 8:
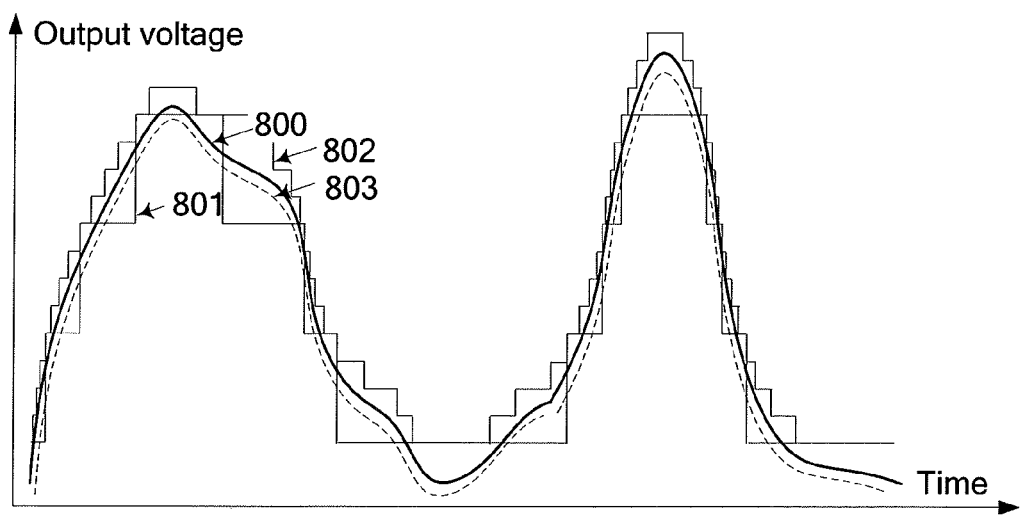

FIG. 8 illustrates a waveform of compensating-reducing errors by the linear amplifier when the controller uses a second control signal. 800 represents an accurate output signal corresponding to the signal to be tracked, 801 represents an output signal tracked by a rough voltage level, 802 represents an output signal tracked by a rough voltage level and a fine voltage level, and 803 represents an output signal tracked by the combination of a rough voltage level, a fine voltage level, and the linear compensation voltage. Thus, the voltage level combined from the rough voltage level and the fine voltage level can track a reference signal accurately. In addition, the power needed by the linear amplifier to correct the switching voltage level tracking error (the integral is equal to the square of the error between the vertical axis of resistive loads 800 and 802 divided by the load) is smaller than the power needed for correcting a single rough switching voltage level (the integral is equal to the square of the error between the vertical axis of resistive loads 800 and 801 divided by the load).

Figure 9:
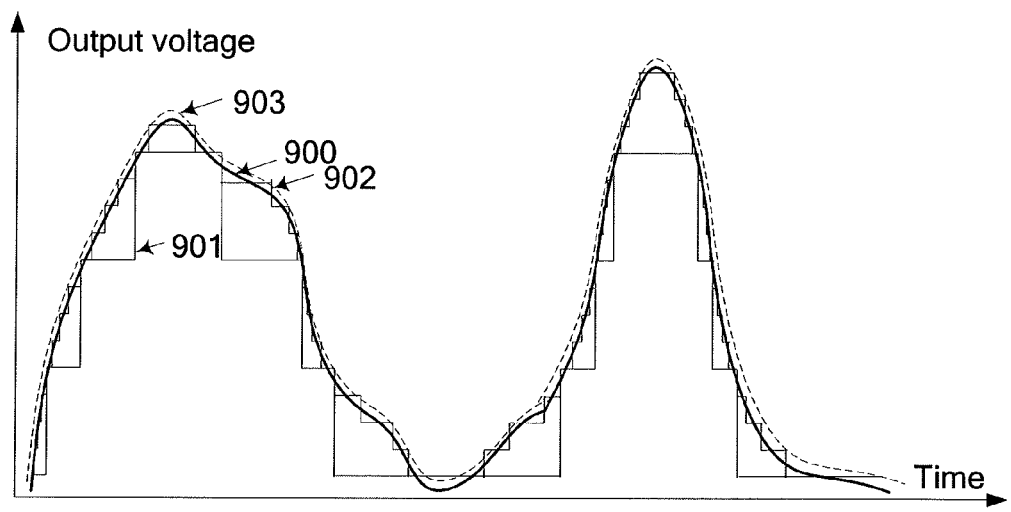

FIG. 9 illustrates a waveform of reducing errors by the linear amplifier when the controller uses a third control signal. 900 represents an accurate output signal corresponding to the signal to be tracked, 901 represents an output signal tracked by a rough voltage level, 902 represents an output signal tracked by a rough voltage level and a fine voltage level, and 903 represents an output signal tracked by the combination of a rough voltage level, a fine voltage level, and the linear compensation voltage. Thus, the voltage level combined from the rough voltage level and the fine voltage level can track a reference signal accurately. In addition, the power needed by the linear amplifier to correct the switching voltage level tracking error (the integral is equal to the square of the error between the vertical axis of resistive loads 900 and 902 divided by the load) is smaller than the power needed for correcting a single rough switching voltage level (the integral is equal to the square of the error between the vertical axis of resistive loads 900 and 901 divided by the load).

As can be seen from that, by using the method for tracking power supplies according to this embodiment of the present disclosure, the controller can output, according to the signal to be tracked, a control signal to control two sets of voltage level selection circuits in selecting at least one tracking voltage level from two groups of isolation voltage levels provided by the isolation power supply. The selected tracking voltage level(s) is provided to supply power to the load circuit through the voltage level selection circuits. Thus, the power supply tracking is implemented on the signal to be tracked. In comparison with the method of selecting directly one-to-one single voltage level from one group of voltage levels, in this embodiment of the present disclosure, a control signal is output, according to the voltage level of the signal to be tracked, to control two sets of voltage level selection circuits in selecting two tracking voltage levels. The voltage level selection circuits connect the two selected tracking voltage levels in series to supply power to the load circuit. Thus, according to this embodiment of the present disclosure the power supply tracking accuracy can be improved, the number of switching circuits and occupied areas of circuits on the PCB can be reduced, and the number of control inputs and the number of power circuits can be reduced, thereby reducing the cost. In addition, the controller matches the delays of each tracking voltage level selected by the voltage level selection circuits, thus the tracking accuracy can be improved. Further, the switching frequency corresponding to the rough voltage level is smaller than the switching frequency corresponding to the equally divided voltage level, thus the switching loss can be reduced and further the overall power supply tracking efficiency can be improved. The linear amplifier can provide a compensation voltage to compensate the tracking error in the case of power supply tracking, thus the power supply tracking accuracy can be improved.

Fourth Embodiment

Figure 10:
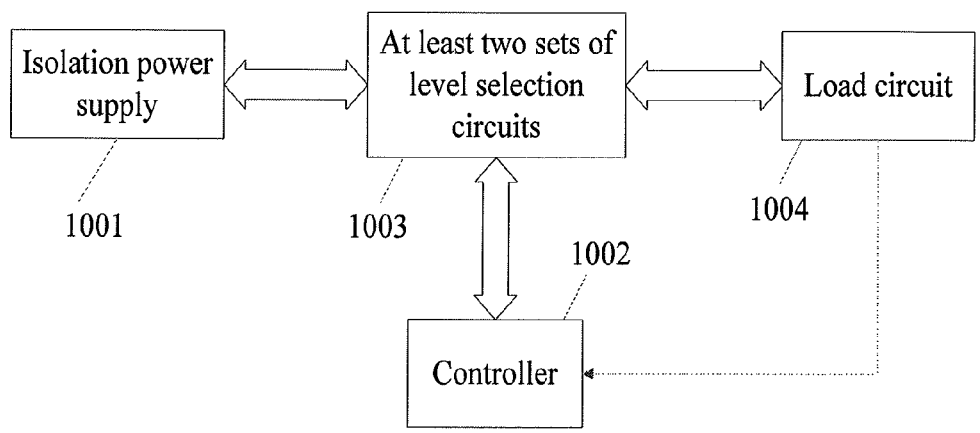
FIG. 10 is a schematic diagram of an apparatus for tracking power supplies according to a fourth embodiment of the present disclosure.

The fourth embodiment of the present disclosure provides an apparatus for tracking power supplies. As shown in FIG. 10, the apparatus for tracking power supplies includes an isolation power supply 1001, a controller 1002, at least two sets of voltage level selection circuits 1003, and a load circuit 1004.

The isolation power supply 1001 is configured to provide at least two groups of isolation voltage levels according to the voltage level interval of a signal to be tracked, where each group of isolation voltage levels includes at least two tracking voltage levels. Specifically, the isolation power supply is a switching power supply. It may be, but is not limited to, at least one of a forward circuit, a backward circuit, a half-bridge circuit, a full-bridge circuit, and a push-pull circuit. The isolation power supply may adopt, but is not limited to, the following form: a coupled primary transformer, one primary circuit, or multiple primary circuits.

The controller 1002 is configured to receive the signal to be tracked, and to output, according to the signal to be tracked, a control signal to control the voltage level selection circuits 1003. Specifically, the control signal may be, but is not limited to, a control voltage level, and the controller may be, but is not limited to, an FPGA, a DSP, a CPLD, or a combination of discrete components.

The at least two sets of voltage level selection circuits 1003 are configured to select at least one tracking voltage level from the at least two groups of isolation voltage levels provided by the isolation power supply under the control of the controller 1002, where each set of voltage level selection circuits selects at most one tracking voltage level from a corresponding group of isolation voltage levels under the control of the controller 1002 to supply power to the load circuit 1004.

Specifically, the voltage level selection circuits 1003 include a semiconductor switch and a drive circuit, where the semiconductor switch is connected with the isolation power supply and the drive circuit is connected with the controller. The drive circuit is configured to drive the semiconductor switch, and the semiconductor switch includes a switch tube and a diode.

The tracking voltage level is specifically a current value or a voltage value. The combination of at least one selected tracking voltage level should be closest to the current value or voltage value of the signal to be tracked to better track power supplies.

In an implementation mode, the isolation power supply 1001 is configured to provide multiple groups of isolation voltage levels. The multiple groups of isolation voltage levels at least include a first group of isolation voltage levels and a second group of isolation voltage levels. The voltage level interval of the signal to be tracked is firstly divided into multiple voltage level intervals which are assigned as the first group of isolation voltage levels. A voltage level interval with a minimum resolution value of the previously divided multiple voltage level intervals is divided again (i.e., sub-divided into multiple voltage level intervals which are assigned as the second group of isolation voltage levels).

In an implementation mode, if at least two sets of voltage level selection circuits select at least two tracking voltage levels from the at least two groups of isolation voltage levels provided by the isolation power supply and each set of voltage level selection circuits selects at most one tracking voltage level from a group of isolation voltage levels, the voltage level selection circuits 1003 are configured to connect the at least two selected tracking voltage levels in series to supply power to the load circuit.

As can be seen from that, by using the apparatus for tracking power supplies according ton this embodiment of the present disclosure, the controller can output, according to the signal to be tracked, a control signal to control at least two sets of voltage level selection circuits in selecting at least one tracking voltage level from at least two groups of isolation voltage levels provided by the isolation power supply. The selected tracking voltage level(s) is provided to supply power to the load circuit through the voltage level selection circuits. Thus, the power supply tracking is implemented on the signal to be tracked. In comparison with the method of selecting directly one-to-one single voltage level from one group of voltage levels, in the fourth embodiment of the present disclosure, a control signal is output, according to the voltage level of the signal to be tracked, to control the voltage level selection circuits in selecting tracking voltage levels. The combination of the selected tracking voltage levels can be closest to the voltage level of the signal to be tracked. Thus, fewer circuits may be used to track power supplies, and the power supply tracking accuracy can be improved.

Fifth Embodiment

In this embodiment, the voltage level interval of the signal to be tracked is firstly divided into multiple voltage level intervals which form a first group of voltage level intervals. A voltage level interval with a minimum resolution value of the previously divided multiple voltage level intervals is divided again into multiple voltage level intervals which form a second group of voltage level intervals. The two groups of voltage level intervals, i.e. the first group of voltage level intervals and the second group of voltage level intervals are isolated from each other, and each group of voltage level intervals forms three tracking voltage levels. The isolation power supply provides two groups of isolation voltage levels corresponding to the two groups of voltage level intervals, where each group of isolation voltage levels includes three tracking voltage levels.

Figure 11:
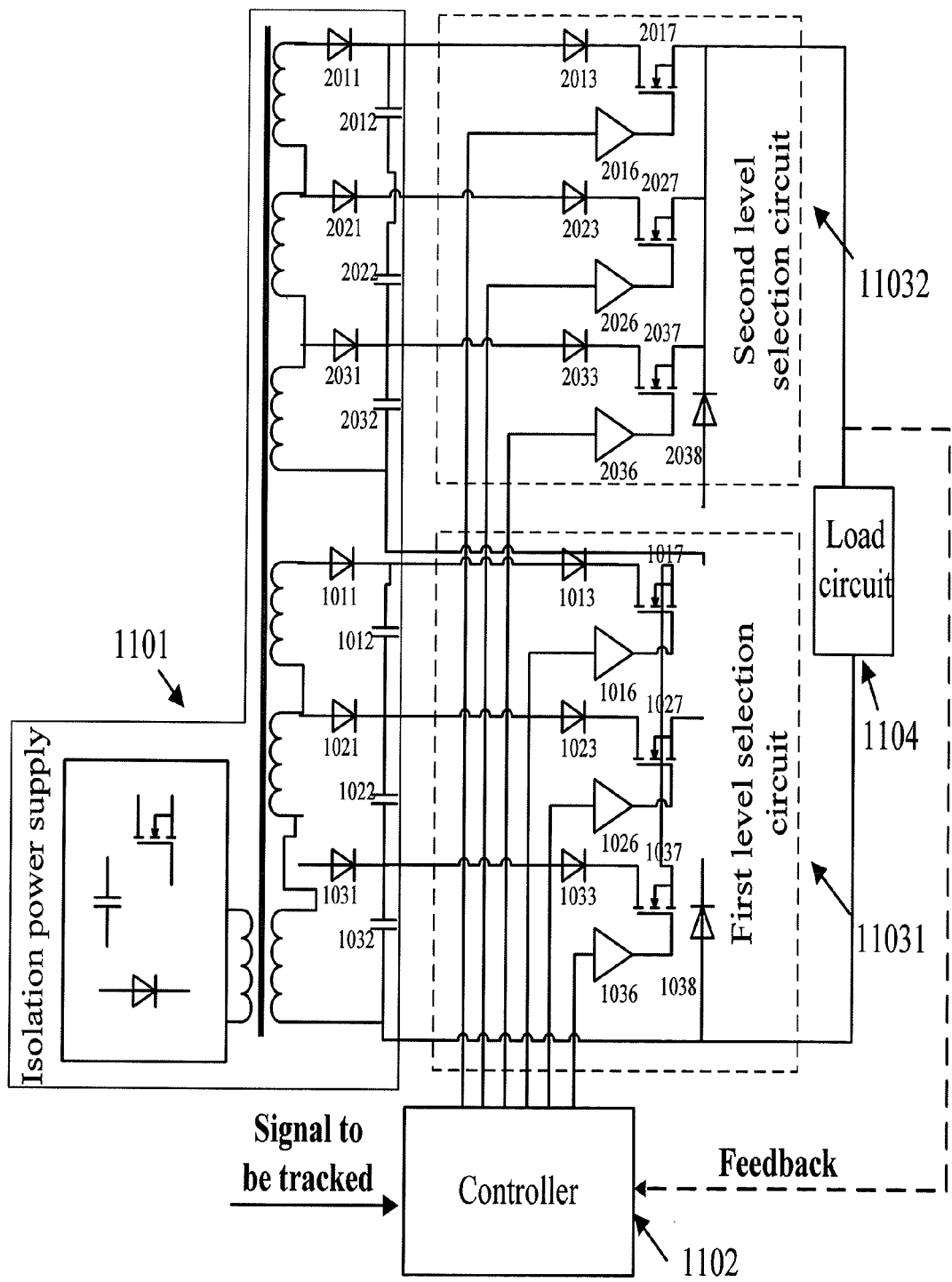
FIG. 11 is a schematic diagram of an apparatus for tracking power supplies according to a fifth embodiment of the present disclosure.

As shown in FIG. 11, the apparatus for tracking power supplies includes an isolation power supply 1101, a controller 1102, two sets of voltage level selection circuits 11031 and 11032, and a load circuit 1004.

The isolation power supply 1101 is configured to provide two groups of isolation voltage levels according to the voltage level interval of a signal to be tracked, where each group of isolation voltage levels includes three tracking voltage levels.

The isolation power supply is configured to provide multiple groups of isolation voltage levels. The multiple groups of isolation voltage levels at least include a first group of isolation voltage levels and a second group of isolation voltage levels, wherein the voltage level interval of the signal to be tracked is firstly divided into multiple voltage level intervals which are assigned as the first group of isolation voltage levels. A voltage level interval with a minimum resolution value of the previously divided multiple voltage level intervals is sub-divided into multiple voltage level intervals which are assigned as the second group of isolation voltage levels.

The isolation power supply 1101 is a switching power supply. The isolation power supply 1101 may be, but is not limited to, at least one of a forward circuit, a backward circuit, a half-bridge circuit, a full-bridge circuit, and/or a push-pull circuit. The isolation power supply may adopt, but is not limited to, the following form a coupled primary transformer or one or multiple primary circuits.

Figure 12:
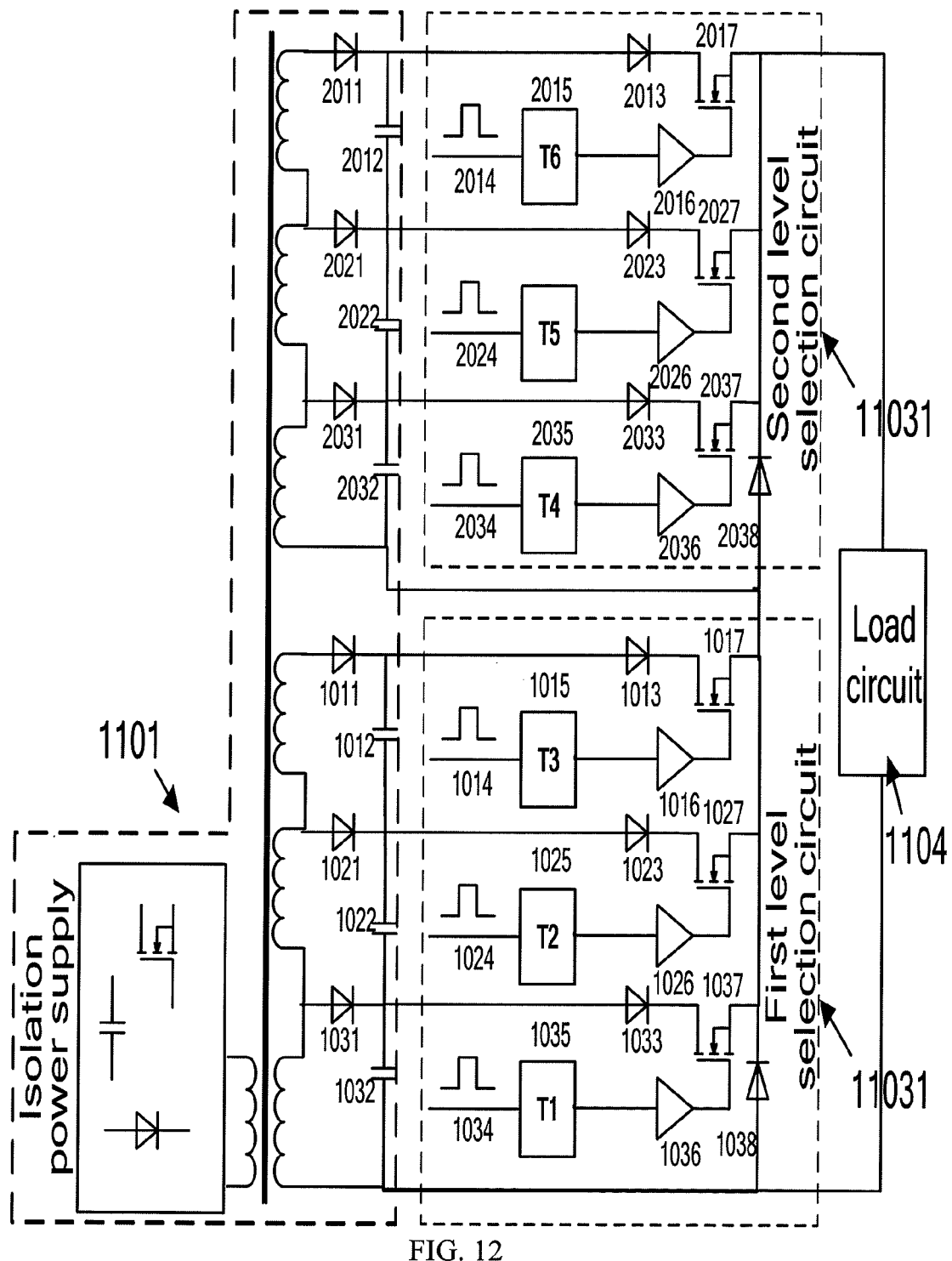
FIG. 12, FIG. 13, and FIG. 14 are a schematic diagram of an isolation power supply in the apparatus for tracking power supplies according to the fifth embodiment of the present disclosure.

As shown in FIG. 12, the isolation power supply 1101 includes a primary transformer.

Figure 13:
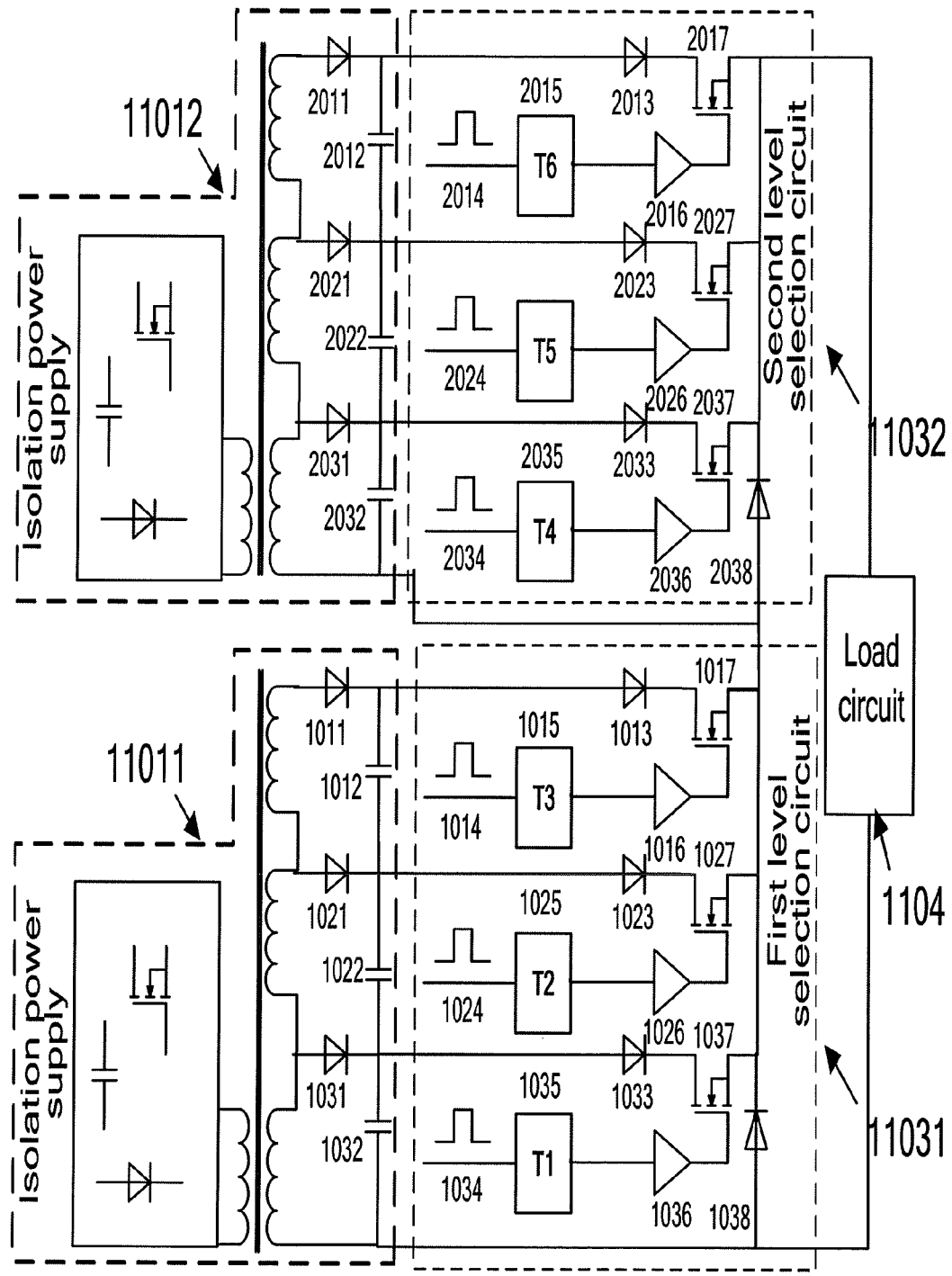

As shown in FIG. 13, the isolation power supply 1101 includes a primary circuit 11011 and a primary circuit 11012.

Figure 14:
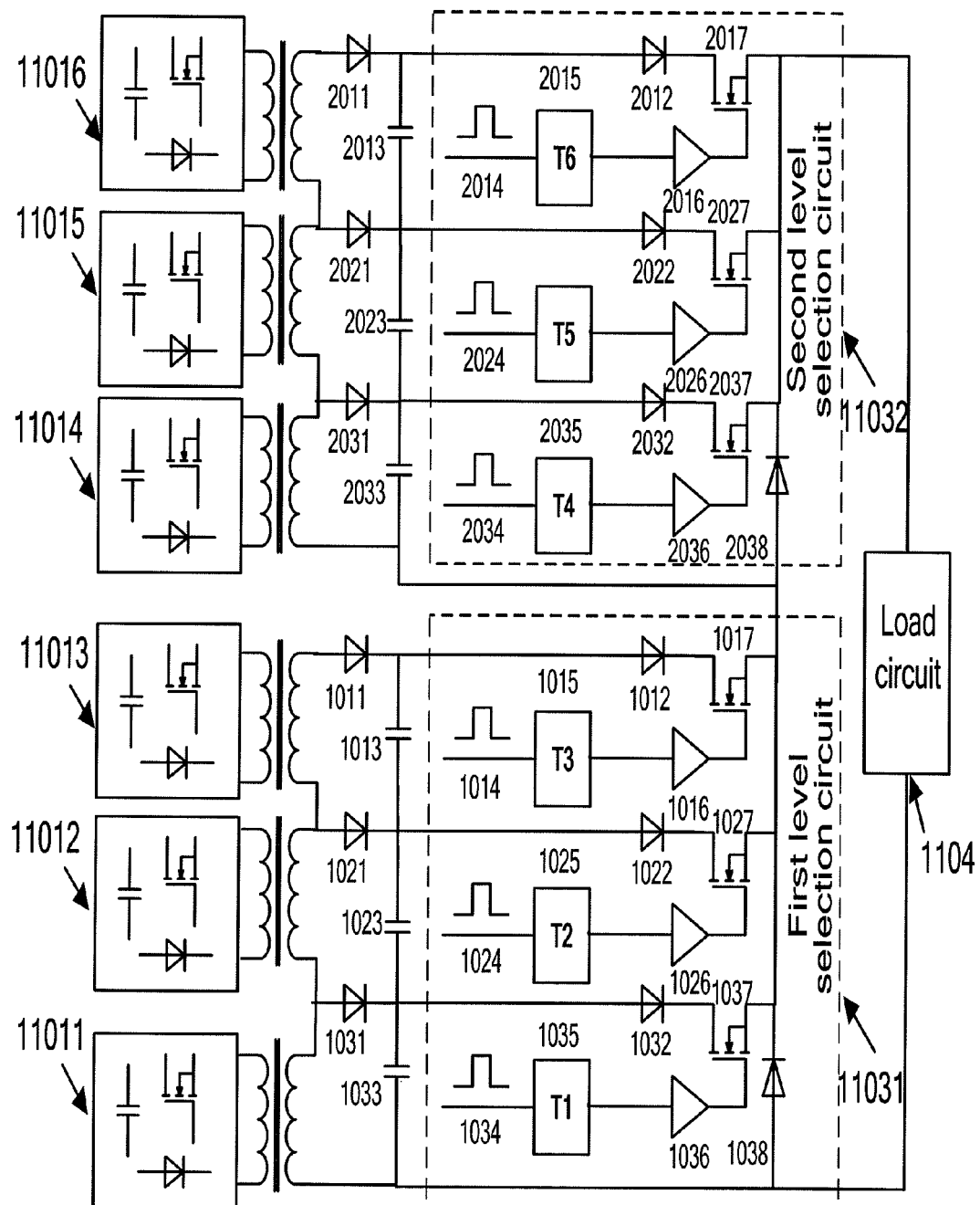

As shown in FIG. 14, the isolation power supply 1101 includes primary circuits 11011, 11012, 11013, 11014, 11015, and 11016.

The controller 1102 is configured to receive the signal to be tracked, and output, according to the signal to be tracked, a control signal to control the voltage level selection circuits 1103, where the controller may be, but is not limited to, an FPGA, a DSP, a CPLD, or a combination of discrete components.

When the frequency of the signal to be tracked is greater than the frequency upper limit, the controller 1102 is further configured to match the delays of each tracking voltage level selected by the voltage level selection circuits to align with the corresponding tracking voltage level. The frequency upper limit may be determined according to the actual condition, and is not limited in this embodiment.

The two sets of voltage level selection circuits 11031 and 11032 are configured to select at least one tracking voltage level from the two groups of isolation voltage levels provided by the isolation power supply under the control of the controller 1102, where each set of voltage level selection circuits is configured to select at most one tracking voltage level from a corresponding group of isolation voltage levels under the control of the controller 1102 to supply power to the load circuit 1004.

Each of the voltage level selection circuits 1103 includes a semiconductor switch and a drive circuit. The semiconductor switch is connected with the isolation power supply, and the drive circuit is connected with the controller and configured to drive the semiconductor switch. The drive circuit may be, but is not limited to, a bootstrap drive circuit or an isolated drive circuit because the drive voltage level reference point is not a ground voltage level. The semiconductor switch includes a switch tube and a diode, where the switch tube may be connected in front of the diode or behind the diode. The diode is configured to prevent pass of different voltage levels in a reverse direction. The switch tube may be, but is not limited to, a high-speed metal-oxide-semiconductor field effect transistor (MOSFET).

As shown in FIG. 11, the output end of the first voltage level selection circuit 11031 is connected with the output reference end of the second voltage level selection circuit 11032. If the first voltage level selection circuit 11031 selects a tracking voltage level from the corresponding isolation voltage levels and the second voltage level selection circuit 11032 selects a tracking voltage level from the corresponding isolation voltage levels, the two sets of voltage level selection circuits may connect the two selected tracking voltage levels in series to supply power to the load circuit.

By using the apparatus for tracking power supplies according to this embodiment of the present disclosure, the controller can output, according to the signal to be tracked, a control signal to control two sets of voltage level selection circuits in selecting at least one tracking voltage level from two groups of isolation voltage levels provided by the isolation power supply. The selected tracking voltage level(s) is provided to supply power to the load circuit through the voltage level selection circuits. Thus, the power supply tracking is implemented on the signal to be tracked. In comparison with the method of selecting directly one-to-one single voltage level from one group of voltage levels, in this embodiment of the present disclosure, a control signal is output, according to the voltage level of the signal to be tracked, to control two sets of voltage level selection circuits in selecting two tracking voltage levels. The voltage level selection circuits connect the two selected tracking voltage levels in series to supply power to the load circuit. Thus, according to this embodiment of the present disclosure, the power supply tracking accuracy can be improved, the number of switching circuits and occupied areas of circuits on the PCB can be reduced, and the number of control inputs and the number of power circuits can be reduced, thus the cost is lower. In addition, the controller matches the delays of each tracking voltage level selected by the voltage level selection circuits, thus the tracking accuracy can be improved. Further, the switching frequency corresponding to the rough voltage level is smaller than the switching frequency corresponding to the equally divided voltage level, thus the switching loss can be reduced and further the overall power supply tracking efficiency can be improved.

Sixth Embodiment

In this embodiment, the voltage level interval of the signal to be tracked is firstly divided into multiple voltage level intervals which form a first group of voltage level intervals, and a voltage level interval with a minimum resolution value of the previously divided multiple voltage level intervals is divided again into multiple voltage level intervals which form a second group of voltage level intervals. The two groups of voltage level intervals, i.e. the first group of voltage level intervals and the second group of voltage level intervals are isolated from each other, and each group of voltage level intervals forms three tracking voltage levels. The isolation power supply provides two groups of isolation voltage levels corresponding to the two groups of voltage level intervals, where each group of isolation voltage levels includes three tracking voltage levels. As compared to the apparatus provided in the fifth embodiment, the apparatus provided in the sixth embodiment further includes a linear amplifier. The linear amplifier provides a compensation voltage. The compensation voltage and the tracking voltage levels selected by the voltage level selection circuits are connected in series to supply power to the load circuit.

Figure 15:
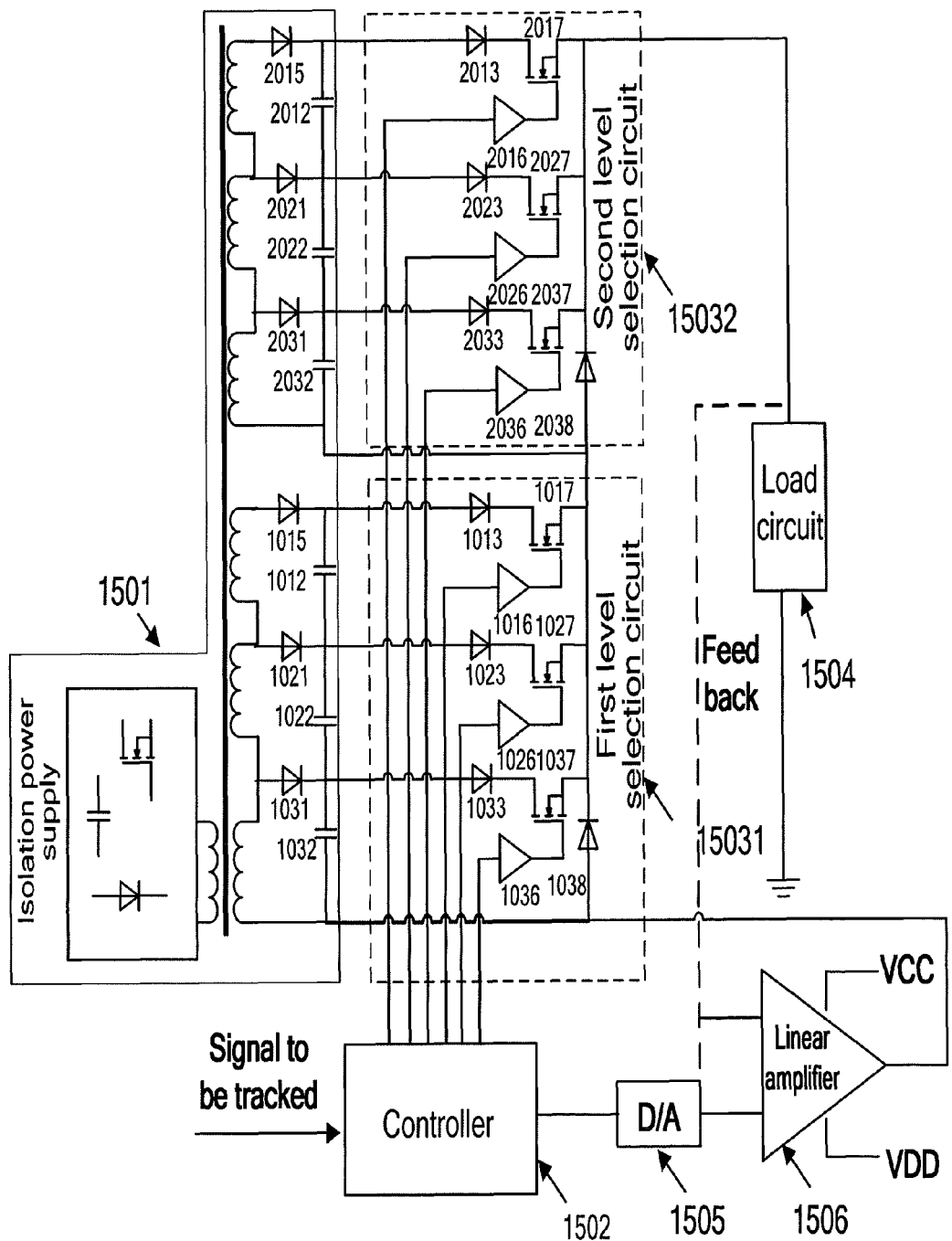
FIG. 15 is a schematic diagram of an apparatus for tracking power supplies according to a sixth embodiment of the present disclosure.

As shown in FIG. 15, the apparatus for tracking power supplies includes an isolation power supply 1501, a controller 1502, two sets of voltage level selection circuits 15031 and 15032, and a load circuit 1504.

The isolation power supply 1501 is configured to provide two groups of isolation voltage levels according to the voltage level interval of a signal to be tracked, where each group of isolation voltage levels includes three tracking voltage levels.

The isolation power supply 1501 is configured to provide a first group of isolation voltage levels and a second group of isolation voltage levels, wherein the voltage level interval of the signal to be tracked is firstly divided into multiple voltage level intervals which are assigned as the first group of isolation voltage levels. A voltage level interval with a minimum resolution value of the previously divided multiple voltage level intervals is divided again i.e. sub-divided into multiple voltage level intervals which are assigned as the second group of isolation voltage levels.

The isolation power supply 1501 may be, but is not limited to, at least one of a forward circuit, a backward circuit, a half-bridge circuit, a full-bridge circuit, and/or a push-pull circuit. The isolation power supply 1501 may adopt, but is not limited to, the following form: a coupled primary transformer, one primary circuit, or multiple primary circuits.

The controller 1502 is configured to receive the signal to be tracked, and output, according to the signal to be tracked, a control signal to control the voltage level selection circuits 1503, where the controller may be, but is not limited to, an FPGA, a DSP, a CPLD, or a combination of discrete components.

When the frequency of the signal to be tracked is greater than the frequency upper limit, the controller 1502 is configured to match the delays of each tracking voltage level selected by the voltage level selection circuits to align with the corresponding tracking voltage level. The frequency upper limit may be determined according to the actual condition, and is not limited in this embodiment.

The two sets of voltage level selection circuits 15031 and 15032 are configured to select at least one tracking voltage level from the at least two groups of isolation voltage levels provided by the isolation power supply under the control of the controller 1502, where each set of voltage level selection circuits is configured to select at most one tracking voltage level from a group of isolation voltage levels under the control of the controller 1502 to supply power to the load circuit 1504.

The output end of the first voltage level selection circuit 15031 is connected with the output reference end of the second voltage level selection circuit 15032. If the first voltage level selection circuit 15031 selects a tracking voltage level from the corresponding isolation voltage levels and the second voltage level selection circuit 15032 selects a tracking voltage level from the corresponding isolation voltage levels, the two sets of voltage level selection circuits may connect the two selected tracking voltage levels in series to supply power to the load circuit.

The apparatus for tracking power supplies may further include a D/A converter 1505 configured to provide the signal to be tracked received by the controller to a linear amplifier 1506 and a linear amplifier 1506 configured to receive the signal to be tracked through the controller 1502 and the D/A converter 1505, to receive the supply voltage of the load circuit 1504 fed back by the load circuit 1504, and to generate a compensation voltage according to the error between the actual voltage level of the signal to be tracked and the supply voltage of the load circuit 1504 fed back by the load circuit 1504.

In this case, the voltage level selection circuits 15031 and 15032 are configured to connect the compensation voltage and the selected tracking voltage levels in series to supply power to the load circuit.

According to the combination relationship between the linear amplifier and the switching voltage level, the linear amplifier may compensate errors, reduce errors, and compensate-reduce error. The linear amplifier may be designed in a push structure, a pull structure, or a push-pull structure. A Class A linear amplifier, a Class B linear amplifier, and a Class AB linear amplifier may be used. The linear power tube may be a MOSFET, a transistor, or a high-frequency power tube with good frequency characteristics. To improve the tracking accuracy, the linear amplifier may adopt output feedback control.

As can be seen from that, by using the apparatus for tracking power supplies according to this embodiment of the present disclosure, the controller can output, according to the signal to be tracked, a control signal to control two sets of voltage level selection circuits in selecting at least one tracking voltage level from two groups of isolation voltage levels provided by the isolation power supply. The selected tracking voltage level(s) is provided to supply power to the load circuit through the voltage level selection circuits. Thus, the power supply tracking is implemented on the signal to be tracked. In comparison with the method of selecting directly one-to-one single voltage level from one group of voltage levels, in this embodiments of the present disclosure, a control signal is output, according to the voltage level of the signal to be tracked, to control two sets of voltage level selection circuits in selecting two tracking voltage levels. The voltage level selection circuits connect the two selected tracking voltage levels in series to supply power to the load circuit. Thus, according to this embodiment of the present disclosure, the power supply tracking accuracy can be improved, the number of switching circuits and occupied areas of circuits on the PCB can be reduced, and the number of control inputs and the number of power circuits can be reduced, thereby reducing the cost. In addition, the controller matches the delays of each tracking voltage level selected by the voltage level selection circuits, thus the tracking accuracy can be improved. Further, the switching frequency corresponding to the rough voltage level is smaller than the switching frequency corresponding to the equally divided voltage level, thus the switching loss can be reduced and the overall power supply tracking efficiency can be further improved. The linear amplifier can provide a compensation voltage to compensate the tracking error in the case of power supply tracking, thus the power supply tracking accuracy can be improved.

Embodiments of the present disclosure are applicable to all scenarios where the voltage tracking or current tracking is needed.

It is understandable to those skilled in the art that all or some of the steps in the preceding embodiments may be implemented by related hardware instructed by a program. The program may be stored in a computer readable storage medium. When the program is executed, the processes of the preceding methods are executed. The storage medium may be a magnetic disk, a compact disk read-only memory (CD-ROM), a read-only memory (ROM) or a random access memory (RAM).

The above descriptions are merely exemplary embodiments of the present disclosure, but not intended to limit the scope of the present disclosure. Any modification, equivalent replacement, or improvement made without departing from the principle of the present disclosure should fall within the scope of the present disclosure. Therefore, the scope of the present disclosure is subject to the appended claims.

What is claimed is:

1. A method for tracking power supplies, comprising:
 receiving, by a controller, a signal to be tracked;
 outputting, by the controller, according to the signal to be tracked, a control signal for:
  controlling at least two sets of voltage level selection circuits for selecting at least one tracking voltage level, wherein the selected at least one tracking voltage level comprises at least two groups of isolation voltage levels selected from the at least two sets of voltage level selection circuits, wherein an isolation power supply provides to the at least two sets of voltage level selection circuits the at least two groups of isolation voltage levels according to a voltage level interval of the signal to be tracked, wherein each of the at least two groups of isolation voltage levels comprises at least two tracking voltage levels, and
  controlling each set of the voltage level selection circuits for selecting at most one tracking voltage level out of a corresponding group of isolation voltage levels from each set of the voltage level selection circuits;
  wherein one of the at least two sets of voltage level selection circuits is connected with an output reference end of the other of the at least two sets of voltage level selection circuits through an output end thereof; and
 providing, by the voltage level selection circuits, the selected at least one tracking voltage level being connected in series to supply power to a load circuit.

2. The method of claim 1, wherein the process of providing the at least two groups of isolation voltage levels by the isolation power supply according to the voltage level interval of the signal to be tracked comprises:
 providing, by the isolation power supply, multiple groups of isolation voltage levels, wherein the multiple groups of isolation voltage levels comprise a first group of isolation voltage levels and a second group of isolation voltage levels,
 wherein the voltage level interval of the signal to be tracked is firstly divided into multiple voltage level intervals which are assigned as the first group of isolation voltage levels, and
 a voltage level interval with a minimum resolution value of the divided multiple voltage level intervals is sub-divided into subdivided multiple voltage level intervals which are assigned as the second group of isolation voltage levels.

3. The method of claim 1, wherein the at least two sets of voltage level selection circuits select at least two tracking voltage levels from the at least two groups of isolation voltage levels and each set of voltage level selection circuits selects at most one tracking voltage level from a group of isolation voltage levels, the process of providing, by the voltage level selection circuits, the selected tracking voltage levels being connected in series to supply power to a load circuit comprises:
 connecting, by the voltage level selection circuits, the at least two selected tracking voltage levels in series to supply power to the load circuit.

4. The method of claim 1, wherein before supplying power to the load circuit, the method comprises:
 receiving, by a first input end of a linear amplifier, the signal to be tracked through the controller and a digital-to-analog (D/A) converter;
 receiving, by a second input end of the linear amplifier, a supply voltage of the load circuit fed back by the load circuit;
 generating, by the linear amplifier, a compensation voltage according to an error between an actual voltage level of the signal to be tracked and the supply voltage of the load circuit fed back by the load circuit; and
 connecting, by the voltage level selection circuits, the compensation voltage and the selected tracking voltage level in series to supply power to the load circuit.

5. The method of claim 3, wherein before supplying power to the load circuit, the method comprises:
 receiving, by a first input end of a linear amplifier, the signal to be tracked through the controller and a digital-to-analog (D/A) converter;
 receiving, by a second input end of the linear amplifier, a supply voltage of the load circuit fed back by the load circuit;
 generating, by the linear amplifier, a compensation voltage according to an error between an actual voltage level of the signal to be tracked and the supply voltage of the load circuit fed back by the load circuit; and
 connecting, by the voltage level selection circuits, the compensation voltage and the selected tracking voltage level in series to supply power to the load circuit.

6. The method of claim 3, wherein the method further comprises:
 matching, by the controller, delays of each tracking voltage level selected by the voltage level selection circuits to align with the corresponding tracking voltage level, wherein the signal to be tracked is greater than a frequency upper limit.

7. An apparatus for tracking power supplies, comprising:
 an isolation power supply configured to provide to at least two sets of voltage level selection circuits, at least two groups of isolation voltage levels according to a voltage level interval of a signal to be tracked, wherein each of the at least two groups of isolation voltage levels comprises at least two tracking voltage levels;
 a controller, configured to receive the signal to be tracked and to output, according to the signal to be tracked, a control signal to control voltage level selection circuits; and
  the at least two sets of voltage level selection circuits, configured to select at least one tracking voltage level, wherein the selected at least one tracking voltage level comprises the at least two groups of isolation voltage levels under the control of the controller, wherein each set of voltage level selection circuits is configured to select at most one tracking voltage level out of a corresponding group of isolation voltage levels from each set of the voltage level selection circuits, wherein one of the at least two sets of voltage level selection circuits is connected with an output reference end of the other of the at least two sets of voltage level selection circuits through an output end thereof, and the at least two sets of voltage level selection circuits connect the selected at least one tracking voltage level in series to supply power to a load circuit.

8. The apparatus of claim 7, wherein the isolation power supply is further configured to provide multiple groups of isolation voltage levels, wherein the multiple groups of isolation voltage levels comprise a first group of isolation voltage levels and a second group of isolation voltage levels, wherein the voltage level interval of the signal to be tracked is firstly divided into multiple voltage level intervals which are assigned as the first group of isolation voltage levels, and a voltage level interval with a minimum resolution value of the divided multiple voltage level intervals is sub-divided into subdivided multiple voltage level intervals which are assigned as the second group of isolation voltage levels.

9. The apparatus of claim 7, wherein the at least two sets of voltage level selection circuits select at least two tracking voltage levels from the at least two groups of isolation voltage levels provided by the isolation power supply and each set of voltage level selection circuits selects at most one tracking voltage level from a corresponding group of isolation voltage levels, the voltage level selection circuits are further configured to connect the at least two selected tracking voltage levels in series to supply power to the load circuit.

10. The apparatus of claim 8, wherein the at least two sets of voltage level selection circuits select at least two tracking voltage levels from the at least two groups of isolation voltage levels provided by the isolation power supply and each set of voltage level selection circuits selects at most one tracking voltage level from a corresponding group of isolation voltage levels, the voltage level selection circuits are further configured to connect the at least two selected tracking voltage levels in series to supply power to the load circuit.

11. The apparatus of claim 7 further comprising:

a digital-to-analog (D/A) converter configured to provide the signal to be tracked received by the controller to a linear amplifier, the linear amplifier being configured to receive the signal to be tracked through the controller and the D/A converter, to receive a supply voltage of the load circuit fed back by the load circuit, and to generate a compensation voltage according to an error between an actual voltage level of the signal to be tracked and the supply voltage of the load circuit fed back by the load circuit, wherein the voltage level selection circuits are further configured to connect the compensation voltage and the selected tracking voltage level in series to supply power to the load circuit.

12. The apparatus of claim 8 further comprising:

a digital-to-analog (D/A) converter configured to provide the signal to be tracked received by the controller to a linear amplifier, the linear amplifier being configured to receive the signal to be tracked through the controller and the D/A converter, to receive a supply voltage of the load circuit fed back by the load circuit, and to generate a compensation voltage according to an error between an actual voltage level of the signal to be tracked and the supply voltage of the load circuit fed back by the load circuit, wherein the voltage level selection circuits are further configured to connect the compensation voltage and the selected tracking voltage level in series to supply power to the load circuit.

13. The apparatus of claim 7, wherein the voltage level selection circuit comprises a semiconductor switch and a drive circuit, the semiconductor switch being connected with the isolation power supply and the drive circuit being connected with the controller, wherein the drive circuit is configured to drive the semiconductor switch.

* * * * *